(12) United States Patent
Jung

(10) Patent No.: US 7,824,841 B2
(45) Date of Patent: Nov. 2, 2010

(54) METHOD FOR FORMING A FINE PATTERN OF A SEMICONDUCTOR DEVICE

(75) Inventor: Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 618 days.

(21) Appl. No.: 11/765,675

(22) Filed: Jun. 20, 2007

(65) Prior Publication Data

US 2008/0131814 A1 Jun. 5, 2008

(30) Foreign Application Priority Data

Dec. 1, 2006 (KR) ...................... 10-2006-0120723

(51) Int. Cl.
*G03F 7/00* (2006.01)
(52) U.S. Cl. ...................... 430/273.1; 430/311; 430/322
(58) Field of Classification Search .............. 430/273.1, 430/311, 322
See application file for complete search history.

(56) References Cited

U.S. PATENT DOCUMENTS

| | | |
|---|---|---|
| 5,212,043 A | 5/1993 | Yamamoto et al. |
| 5,750,680 A | 5/1998 | Kim et al. |
| 6,051,678 A | 4/2000 | Kim et al. |
| 6,132,926 A | 10/2000 | Jung et al. |
| 6,143,463 A | 11/2000 | Jung et al. |
| 6,150,069 A | 11/2000 | Jung et al. |
| 6,180,316 B1 | 1/2001 | Kajita et al. |
| 6,225,020 B1 | 5/2001 | Jung et al. |
| 6,235,447 B1 | 5/2001 | Lee et al. |
| 6,235,448 B1 | 5/2001 | Lee et al. |
| 6,461,983 B1 * | 10/2002 | Davlin et al. ................. 438/782 |
| 7,264,918 B2 * | 9/2007 | Endo et al. .................. 430/326 |
| 7,303,858 B2 | 12/2007 | Jung et al. |
| 2006/0178005 A1 | 8/2006 | Endo et al. |

FOREIGN PATENT DOCUMENTS

JP 2006267521 10/2006

* cited by examiner

*Primary Examiner*—Thorl Chea
(74) *Attorney, Agent, or Firm*—Townsend and Townsend and Crew LLP

(57) ABSTRACT

A method for forming a pattern of a semiconductor device using an immersion lithography process includes pretreating a top portion of the photoresist film with an alkane solvent or alcohol in the immersion lithography process to form a uniform over-coating film.

13 Claims, 3 Drawing Sheets

METHOD FOR FORMING A FINE PATTERN OF A SEMICONDUCTOR DEVICE

CROSS-REFERENCES TO RELATED APPLICATIONS

The present application claims priority to Korean patent application number 10-2006-0120723, filed on Dec. 1, 2006, which is incorporated by reference in its entirety.

BACKGROUND OF THE INVENTION

The present invention relates to a method for forming a fine pattern of a semiconductor device using an immersion lithography process.

Due to increased integration of semiconductor devices, improvement of technologies for forming a fine pattern of sub-micron has been required, and research for developing photolithography processes have been accelerated to achieve integration of circuits in the semiconductor manufacturing process.

In a conventional photolithography process, light sources such as g-line (436 nm) and i-line (365 nm) are used as exposure light sources. Recently, KrF (248 nm) and ArF (193 nm) which are light sources of a Deep Ultra Violet (DUV) region and $F_2$ (157 nm) and Extremely Ultraviolet (EUV) (13 nm) which are short wavelength light sources have been applied to the manufacturing process.

Since new light sources require development of a new exposer, it is costly in terms of manufacturing cost. Also, it is difficult to manufacture a highly-integrated semiconductor device having a fine pattern because the resolution of the pattern obtained from the exposer equipment using a short wavelength light source is limited to 0.1 μm Instead of a dry exposing process, an immersion lithography process has been applied to the device manufacturing process. The immersion lithography process uses a system comprising a solution between an exposure lens and a wafer to perform an exposure process. Since the immersion lithography process is performed with a solution having a refractive index between the photoresist film and the exposure lens as a medium, a hyper NA (numerical aperture) lens can be embodied corresponding to a refractive index of water to the air, thereby increasing the resolution of the lithography process. There is also no decrease in the depth of focus so that it is possible to form an ultra-precision pattern having a small pitch.

Since the medium used in the immersion lithography process is a solution such as water having a high specific heat, a part of the solution remains over the pattern which can generate a water mark effect having a circular bridge type or a bubble after a drying process. Furthermore, contaminant is eluted from the photoresist film to the medium (solution) to contaminate the contacted exposure lens.

SUMMARY OF THE INVENTION

The embodiments of the present invention relate to a method for forming a fine pattern of a semiconductor device which includes pretreating a top portion of a photoresist film with an alkane solvent or alcohol in an immersion lithography process and forming an over-coating film over the pretreated photoresist film.

According to an embodiment of the present invention, a method for forming a pattern of a semiconductor device comprises the steps of: coating a photoresist film over a substrate including an underlying layer; pretreating the surface of the photoresist film with solvent, the solvent including an alcohol, alkane, or both; forming an over-coating film over the photoresist film; and exposing a structure with an immersion exposer, the structure including the over coating film provided over the photoresist film.

DETAILED DESCRIPTION OF THE SPECIFIC EMBODIMENT

The present invention will be described in detail with reference to the accompanying drawings.

Figure 1:
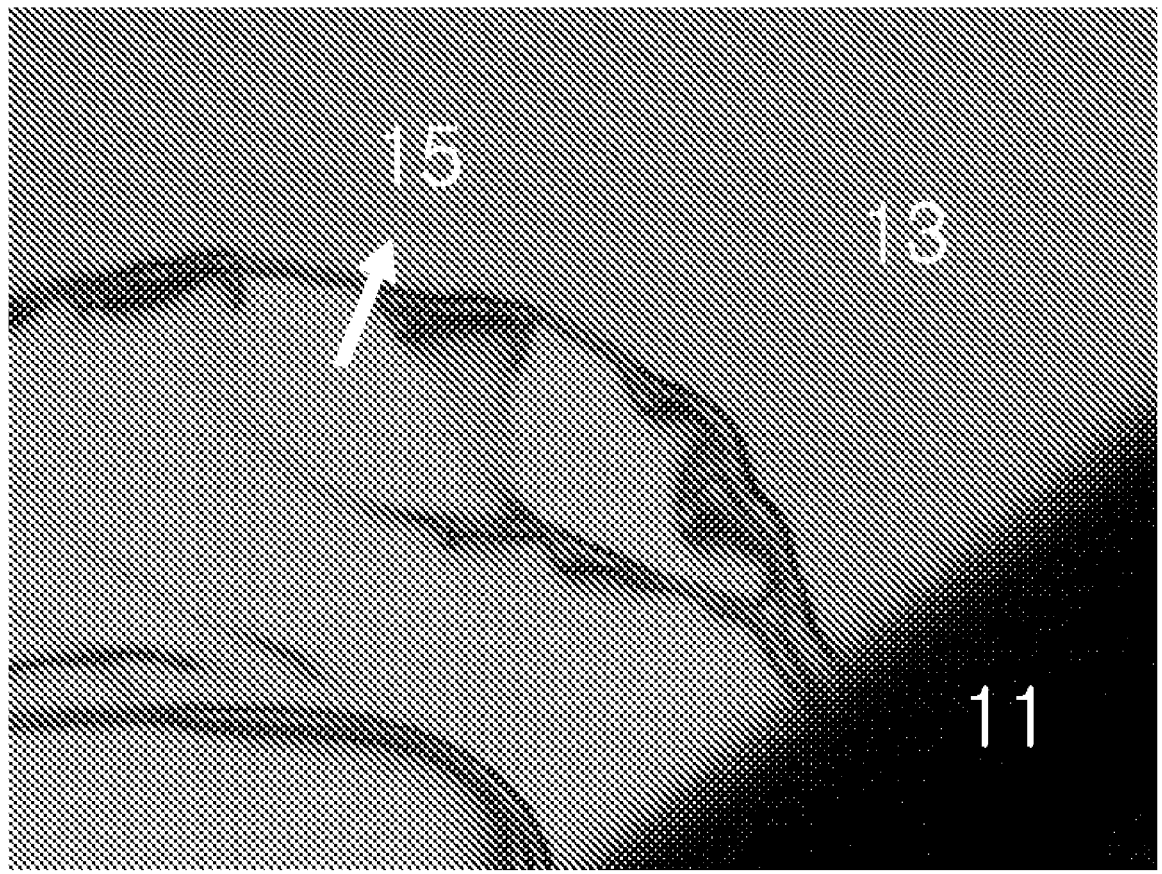
FIG. 1 is a SEM photograph illustrating a method for forming a fine pattern of a semiconductor device according to an embodiment of the present invention.

FIG. 1 is a SEM photograph illustrating a method for forming a fine pattern of a semiconductor device according to an embodiment of the present invention.

A photoresist composition is coated over an underlying formed on the substrate. The top portion of the photoresist film is pretreated with a solvent of the photoresist composition. An over-coating film 13 is formed over the pretreated photoresist film 11 to prevent the contamination of the contacted exposure lens. The immersion lithography process is performed on the structure.

Here, A part of the photoresist film is dissolved in the above pretreating solvent, and the dissolved photoresist film 15 is mixed with the solvent of the over-coating composition when the over-coating film is formed. As a result, it is difficult to form a uniform over-coating film.

Figure 2A:
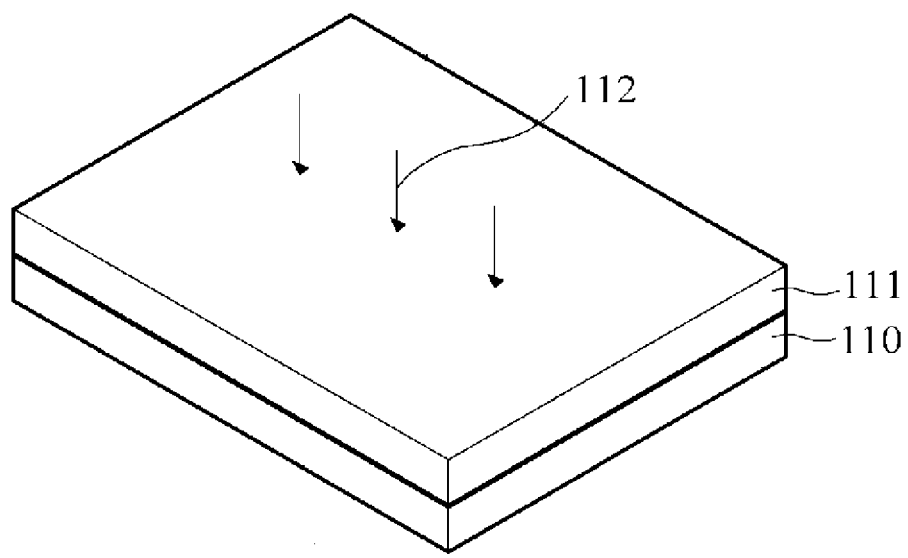
FIGS. 2a and 2b are cross-sectional diagrams illustrating a method for forming a fine pattern of a semiconductor device according to a specific embodiment of the present invention.
Figure 2B:
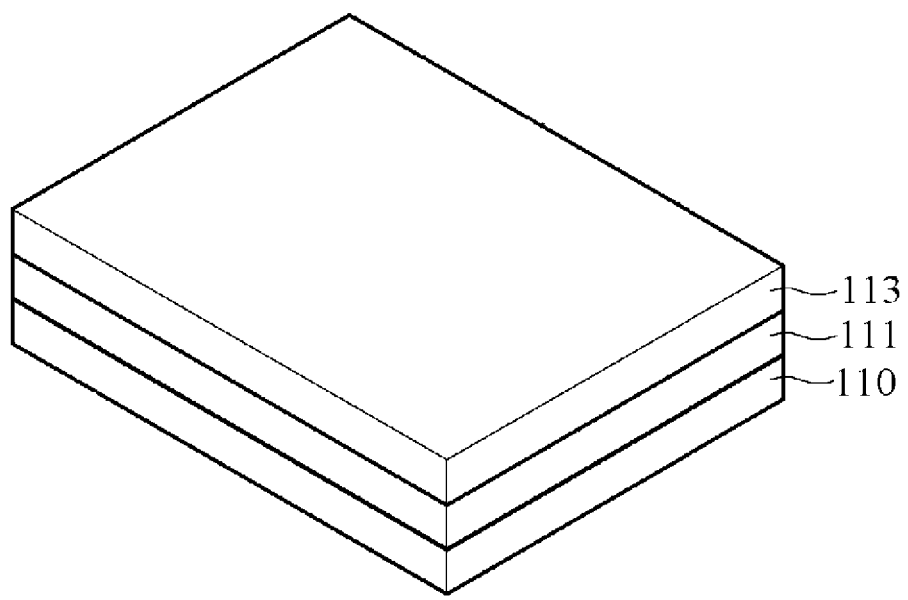

FIGS. 2a and 2b are cross-sectional diagrams illustrating a method for forming a fine pattern of a semiconductor device according to a specific embodiment of the present invention.

A photoresist composition is coated over an underlying layer 110 formed over a semiconductor substrate and soft-baked at 100~120° C. for about 80~100 seconds to obtain a photoresist film 111.

Any kinds of underlying layers can be used. For example, the underlying layer is selected from the group consisting of: a silicon nitride film, a silicon oxide film, a borophosphosilicate glass, a phosphosilicate glass, an undoped silicate glass, a plasma enhanced-tetraethoxysilicate glass (PE-TEOS) oxide film, a silicon oxy nitride film (SiON), a polysilicon film, an organic scattered reflection film, an inorganic scattered reflection film and a combination thereof.

Examples of photoresist compositions that can be used include those disclosed in U.S. Pat. No. 5,212,043 (May 18, 1993), U.S. Pat. No. 5,750,680 (May 12, 1998), U.S. Pat. No. 6,051,678 (Apr. 18, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001), all of which are incorporated by reference. The photoresist film includes a base resin selected from a group consisting of a polyvinylphenol type, a polyhydroxystyrene type, a polynorbornene type, a polyadamantyl type, a polyimide type, a polyacrylate type, a polymethacrylate type, a polyfluorine type, and a combination thereof. Specifically, the base resin of the photoresist film includes a polymer selected from the group consisting of a ROMA-type polymer (including a Ring-Opened Maleic Anhydride repeating unit); COMA-type polymer (including a Cyclo-Olefin repeating unit, a Maleic Anhydride repeating unit and a methacrylate or acrylate repeating unit); and a hybrid-type polymer thereof.

FIG. 2a shows a pretreatment process 112 performed on the photoresist film 111. The pretreatment process is performed with a solvent which is sprayed in a gas state or coated in a liquid state one or more times. The pretreatment process is performed at a temperature ranging from 60 to 150° C. for 50~150 seconds.

Any alcohol which do not dissolve the photoresist film can be used. The alcohol is a $C_4$ or more alcohol. For example, the alcohol may be a $C_4$-$C_{15}$ alcohol. In the present embodiment, the alcohol is one or more selected from the group consisting of butanol, pentanol, heptanol, octanol, nonanol and decanol.

Any alkane solvents which do not dissolve the photoresist film can be used. The alkane solvent is a $C_7$ or more alkane solvent. For example, the alkane solvent may be a $C_7$-$C_{20}$ alkane solvent. In the present embodiment, the alkane solvent is one or more selected from the group consisting of heptane, octane, nonane and decane.

FIG. 2b shows an over coating film 113 formed on the pretreated photoresist film 111. The over-coating film includes a fluorine hydrocarbon compound with a low refractive index. For example, an over-coating film for immersion lithography may be used in the present embodiment. The over-coating film comprise a solvent such as a $C_4$ or more alcohol and a $C_7$ or more alkane, and perfluoroalkyl compound dissolved in the $C_4$ or more alcohol and a $C_7$ or more alkane. For example, the over-coating film is formed of TCX-041 (produced by JSR Co.) by a spin-coating method.

Figure 3:
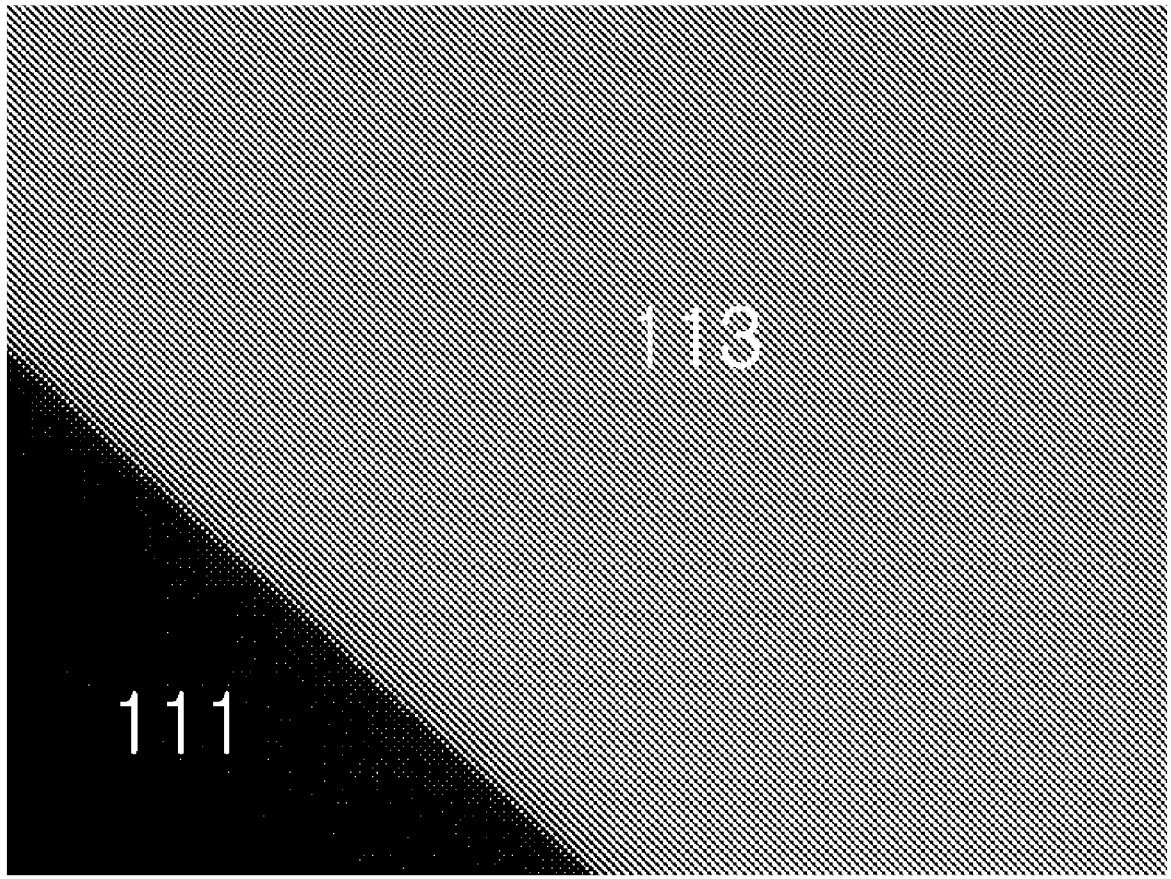
FIG. 3 is a SEM photograph illustrating a method for forming a pattern of a semiconductor device according to a specific embodiment of the present invention where over coating composition is formed over a pretreated photoresist film.

Since the photoresist film is pretreated with a solvent similar to that of the over-coating film instead of the solvent which dissolves the photoresist film, the photoresist film does not dissolved in the above pretreating solvent. Also, it is prevent to mix the photoresist film and over coating film when the over-coating film is formed and to improve the wetting property of the surface of the photoresist film. As a result, as shown in FIG. 3, it is possible to coat the uniform over-coating film with a small amount of the solvent over a 300 mm wafer in a subsequent process, thereby decreasing the manufacturing cost.

In one embodiment of the present invention, the method may further comprise forming a bottom anti-reflection film over the underlying layer before the photoresist film is formed. The top portion of the bottom anti-reflection film is pretreated with a solution selected from a group consisting of propyleneglycol methyl ether acetate (PGMEA), propyleneglycol monomethyl ether, methyl 3-methoxypropionate, t-butyl acetate, and combinations thereof, to have a pro-photosensitivity. A photoresist film is formed over the resulting structure.

The immersion lithography process is performed with an exposure light source selected from a group consisting of KrF, ArF, VUV, EUV, E-beam, X-ray and ion-beam. An exposure energy used ranges from 0.1 to 100 mJ/cm$^2$.

The immersion lithography process is performed with a solvent selected from a group consisting of water, hexane, xylene, cyclooctane, perfluoropolyether, and combinations thereof, as the medium.

As described above, a method for forming a fine pattern of a semiconductor device according to an embodiment of the present invention includes pretreating a photoresist film with a solvent for forming an over-coating film and forming an over-coating film over the resulting structure, thereby obtaining the uniform over-coating film with a small amount of solvent.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a pattern of a semiconductor device, the method comprising:
   forming a bottom anti-reflection film over an underlying layer on a substrate;
   coating a photoresist composition over the underlying layer and baking the photoresist composition to form a photoresist film;
   pretreating a surface of the photoresist film with a solvent, the solvent including $C_4$-$C_{15}$ alcohol, $C_7$-$C_{20}$ alkane, or both;
   forming an over-coating film over the photoresist film; and
   exposing the over-coating film and the photoresist film with an immersion exposer.

2. The method according to claim 1, wherein the underlying layer is selected from the group consisting of: a silicon nitride film, a silicon oxide film, a borophosphosilicate glass, a phosphosilicate glass, an undoped silicate glass, a plasma enhanced-tetraethoxysilicate glass (PE-TEOS) oxide film, a silicon oxy nitride film, a polysilicon film, an organic scattered reflection film, an inorganic scattered reflection film, and a combinations thereof.

3. The method according to claim 1, wherein the photoresist composition includes a base resin selected from the group consisting of a polyvinylphenol resin, a polyhydroxystyrene resin, a polynorbornenee resin, a polyadamantyl type resin, a polyimide resin, a polyacrylate resin, a polymethacrylate resin, a polyfluorine resin, and a combination thereof.

4. The method according to claim 1, wherein the photoresist composition includes a base resin selected from the group consisting of a ROMA polymer (including a Ring-Opened Maleic Anhydride repeating unit); COMA polymer (including a Cyclo-Olefin repeating unit, a Maleic Anhydride repeating unit and a methacrylate or acrylate repeating unit); and a hybrid polymer thereof.

5. The method according to claim 1, wherein the pretreatment process is performed spraying the pretreating solvent in a gas state or coating the solvent in a liquid state, and the photoresist film does not dissolve in the pretreating solvent.

6. The method according to claim 1, wherein the $C_4$-$C_{15}$ alcohol selected from the group consisting of butanol, pentanol, heptanol, octanol, nonanol and decanol.

7. The method according to claim 1, wherein the $C_7$-$C_{20}$ alkane is selected from the group consisting of heptane, octane, nonane and decane.

8. The method according to claim 1, wherein the over-coating film includes a fluorine hydrocarbon compound and solvent.

9. The method according to claim 8, wherein the solvent includes a $C_4$-$C_{15}$ alcohol or a $C_7$-$C_{20}$ alkane solvent.

10. The method according to claim 8, wherein the fluorine hydrocarbon compound is a perfluoroalkyl compound dissolved in a $C_4$-$C_{15}$ alcohol or a $C_7$-$C_{20}$ alkane solvent.

11. The method according to claim 1, further comprising pretreating the top portion of the bottom anti-reflection film with a solution selected from the group consisting of propyleneglycol methyl ether acetate, propyleneglycol monomethyl ether, methyl 3-methoxypropionate, t-butyl acetate, and combinations thereof, before coating the photoresist film.

12. The method according to claim 1, wherein the immersion lithography process is performed with a light source selected from the group consisting of KrF, ArF, VUV, EUV, E-beam, X-ray and ion-beam.

13. The method according to claim 1, wherein the immersion lithography process is performed with a medium selected from the group consisting of water, hexane, xylene, cyclooctane, perfluoropolyether, and combinations thereof.

* * * * *